United States Patent
Murthy et al.

(10) Patent No.: US 6,797,556 B2
(45) Date of Patent: Sep. 28, 2004

(54) MOS TRANSISTOR STRUCTURE AND METHOD OF FABRICATION

(75) Inventors: Anand Murthy, Beaverton, OR (US); Robert S. Chau, Beaverton, OR (US); Patrick Morrow, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/338,371

(22) Filed: Jan. 7, 2003

(65) Prior Publication Data

US 2003/0098479 A1 May 29, 2003

Related U.S. Application Data

(62) Division of application No. 09/475,452, filed on Dec. 30, 1999.

(51) Int. Cl.[7] ............................................. H01L 29/72
(52) U.S. Cl. ..................... 438/231; 438/183; 438/199; 438/300; 438/301; 257/288; 257/408
(58) Field of Search ........................ 438/183, 198, 438/231, 300, 301; 257/288, 408

(56) References Cited

U.S. PATENT DOCUMENTS

| | | | | |
|---|---|---|---|---|
| 5,824,587 A | * | 10/1998 | Krivokapic | ................. 438/300 |
| 5,970,351 A | * | 10/1999 | Takeuchi | ..................... 438/300 |
| 6,057,582 A | * | 5/2000 | Choi | .......................... 257/408 |

\* cited by examiner

*Primary Examiner*—Edward Wojciechowicz
(74) *Attorney, Agent, or Firm*—Blakely, Sokoloff, Taylor & Zafman LLP

(57) ABSTRACT

An MOS device comprising a gate dielectric formed on a first conductivity type region. A gate electrode formed on the gate dielectric. A pair of sidewall spacers are formed along laterally opposite sidewalls of the gate electrode. A pair of deposited silicon or silicon alloy source/drain regions are formed in the first conductivity region and on opposite sides of a gate electrode wherein the silicon or silicon alloy source/drain regions extend beneath the gate electrode and to define a channel region beneath the gate electrode in the first conductivity type region wherein the channel region directly beneath the gate electrode is larger than the channel region deeper into said first conductivity type region.

21 Claims, 15 Drawing Sheets

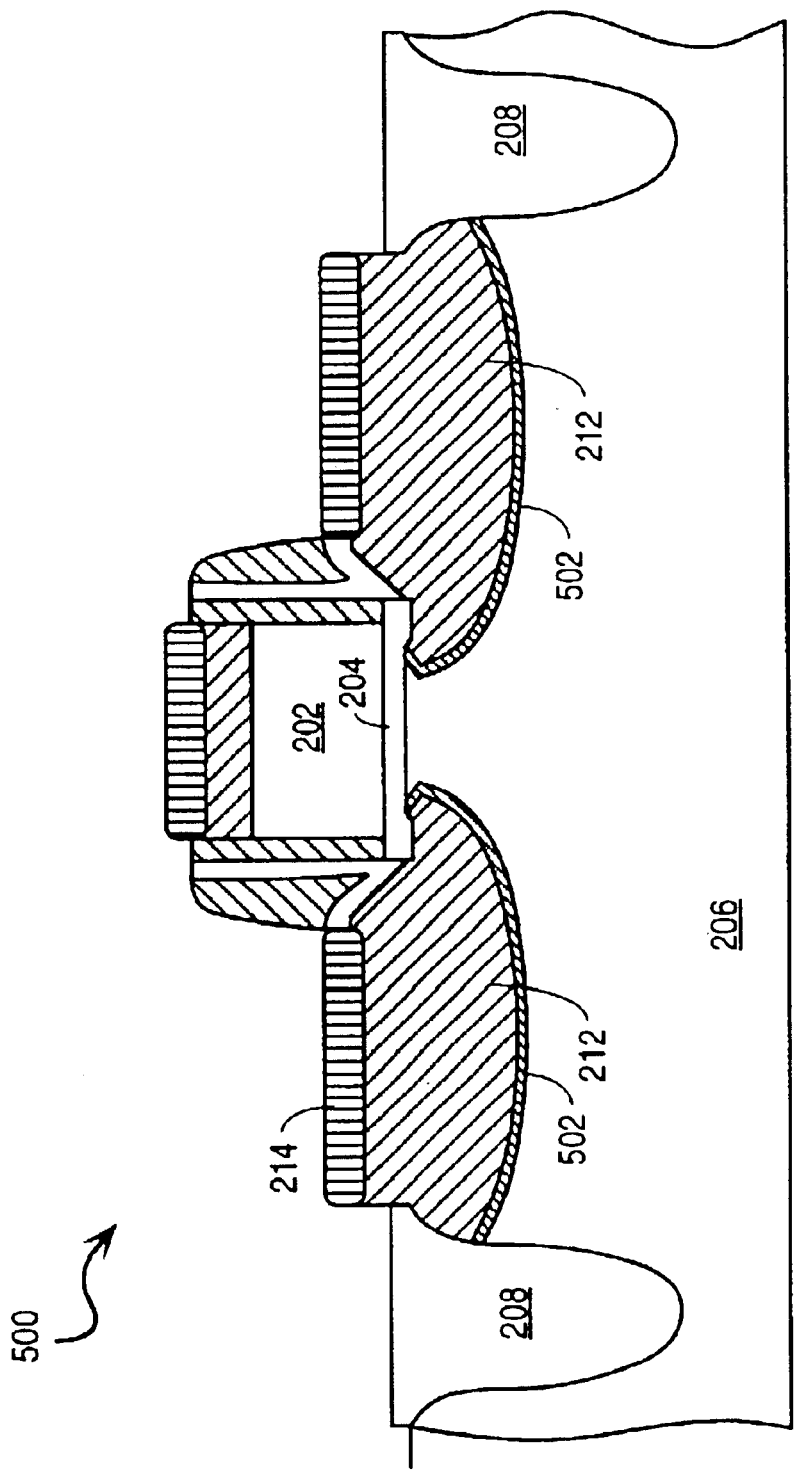

MOS TRANSISTOR STRUCTURE AND METHOD OF FABRICATION

This is a Divisional application of Ser. No.:09/472,452 filed Dec. 30, 1999, which is presently pending.

BACKGROUND OF THE INVENTION

1. Field of the Invention

The present invention relates to the field of semiconductor manufacturing and more specifically to a metal oxide semiconductor transistor.

2. Discussion of Related Art

Today literally millions of individual transistors are coupled together to form very large-scale integrated (VSLI) circuits, such as microprocessors, memories, and application specific integrated circuits (IC's). Presently, the most advanced IC's are made up of approximately three million transistors, such as metal oxide semiconductor (MOS) field effect transistors having gate lengths on the order of 0.25 µm. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 µm. Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104, which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of gate electrode 102 and over tip regions 110 are a pair of sidewall spacers 108. A pair of source/drain contact regions 120 are then formed, by ion implantation, in substrate 106 substantially in alignment with the outside edges of sidewall spacers 108.

As the gate length of transistor 100 is scaled down in order to fabricate a smaller transistor, the depth at which tip region 110 extends into substrate 106 must also be scaled down (i.e., decreased) in order to improve punch-through characteristics of the fabricated transistor. Unfortunately, present techniques can not scale the size of the tip regions to support the scaling of the gate length.

SUMMARY OF THE INVENTION

An MOS device comprising a gate dielectric formed on a first conductivity type region. A gate electrode formed on the gate dielectric. A pair of sidewall spacers are formed along laterally opposite sidewalls of the gate electrode. A pair of deposited silicon or silicon alloy source/drain regions are formed in the first conductivity region and on opposite sides of a gate electrode wherein the silicon or silicon alloy source/drain regions extend beneath the gate electrode and define a channel region beneath the gate electrode in the first conductivity type region wherein the channel region directly beneath the gate electrode is larger than the channel region deeper into said first conductivity type region.

BRIEF DESCRIPTION OF THE DRAWINGS

FIG. 15 is an illustration of a cross-sectional view showing an alternative embodiment of the present invention.

DETAILED DESCRIPTION OF THE PRESENT INVENTION

A novel metal oxide semiconductor (MOS) field effect transistor and its method of fabrication is described. In the following description numerous specific details are set forth such as specific materials, dimensions, and processes etc. in order to provide a thorough understanding of the present invention. It will be obvious, however, to one skilled in the art that the present invention may be practiced without the specific details. In other instances well known semiconductor equipment and processes have not been described in particular detail in order to avoid unnecessarily obscuring the present invention.

The present invention is a novel MOS transistor structure with improved performance and scalability and its method of fabrication. In one embodiment of the present invention the structure includes inwardly concaved source/drain regions formed with deposited silicon or silicon alloys. The inwardly concaved source/drain regions create a channel region which is larger at the silicon/gate oxide interface and narrower deeper into the substrate. With this geometry a larger channel length ($L_{met}$) is achieved during the "off" state while a smaller $L_{met}$ is achieved during the "on" state. In another embodiment of the present invention the device includes a gate dielectric which is thicker at the extension (or tip) overlap region, which improves the robustness of the gate oxide edge leakage. In another embodiment of the present invention the device includes raised source/drain regions having a (311) facet which helps reduce the fringing capacitance of the device. The novel features of the present invention such as an inwardly concaved source/drain region, a thicker gate oxide at the gate edge and a raised source/drain region with an engineered facet can be used alone to improve device performance and scalability or can be used in combination with one another or insubsets of one another to provide an MOS device with improved short channel effects, reduce gate edge leakage, and reduce overlap capacitance.

Figure 1:
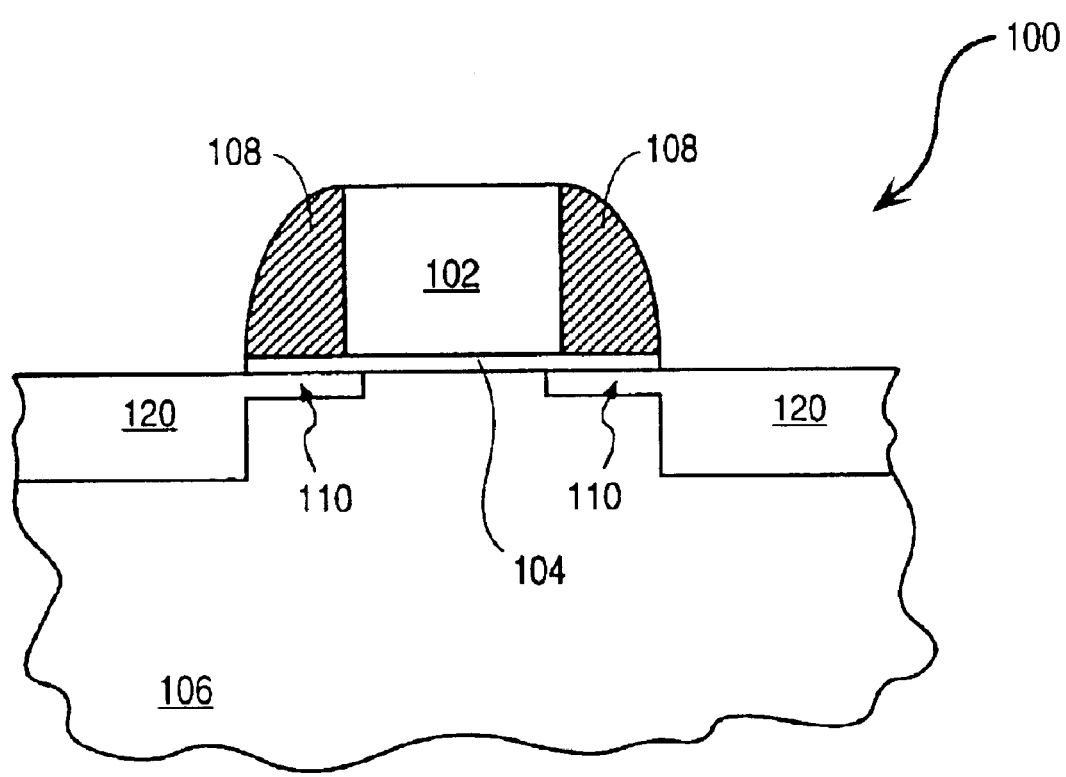
FIG. 1 is an illustration of a cross-sectional view of a conventional MOS transistor.
Figure 2:
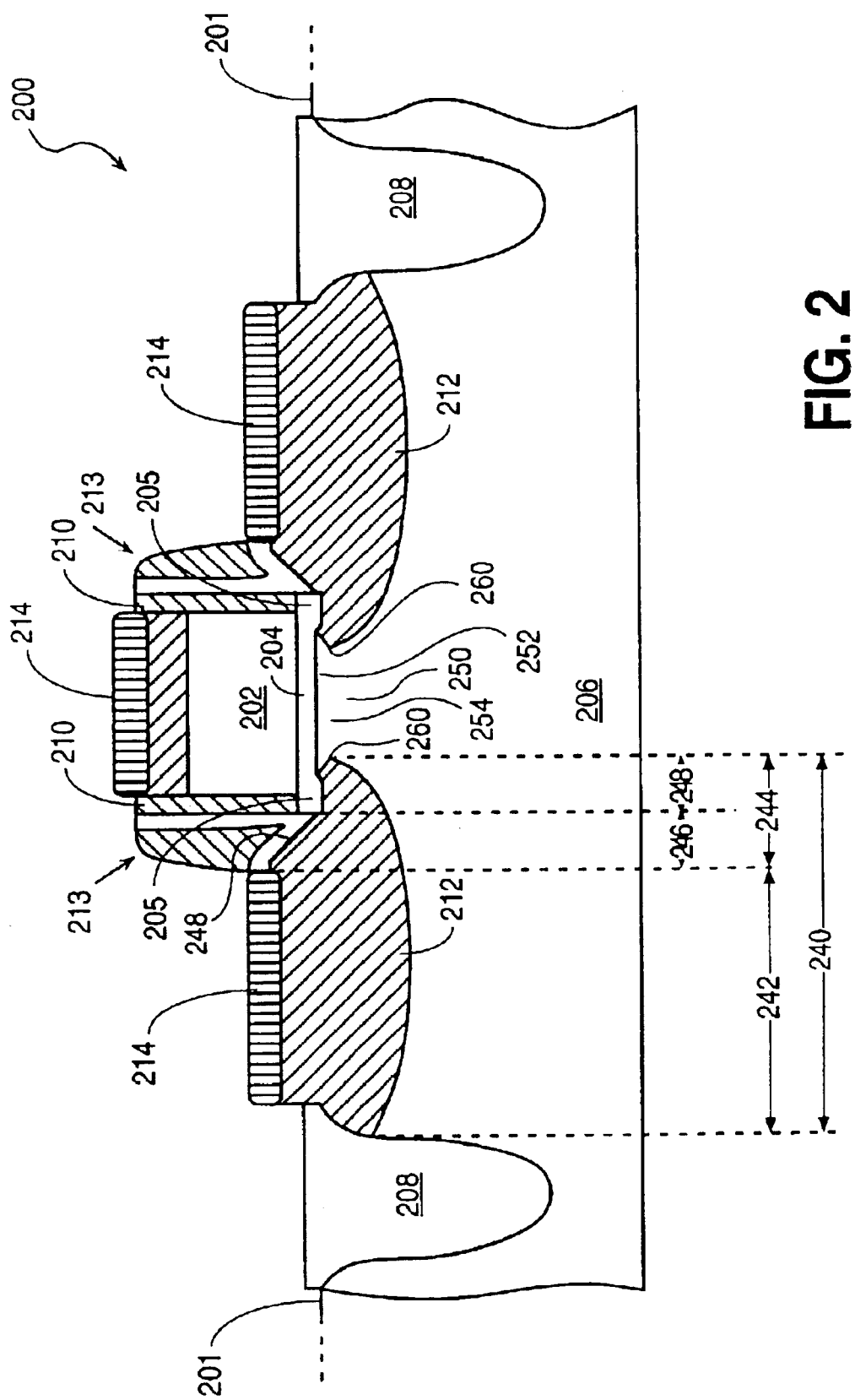
FIG. 2 is an illustration of a cross-sectional view of a MOS transistor in accordance with an embodiment of the present invention.

FIG. 2 is an illustration of an embodiment of a p-channel MOS device 200 in accordance with the present invention. Device 200 includes a gate electrode 202 formed on a gate dielectric 204 which in turn is formed on an n-type region 206 of a substrate formed between isolation regions 208. The gate electrode 202 can have a drawn length down to 50 nm (500 Å). A first pair of sidewall spacers 210, such as silicon nitride spacers, are formed along laterally opposite sidewalls of gate electrode 202 and are used to isolate deposited silicon or silicon alloy film 212 used to form source/drain regions from gate electrode 202. A second pair of thicker sidewall spacers 213 can be formed adjacent to the first pair of sidewall spacers 210 and onto deposited silicon regions 212.

The MOS device 200 includes a pair of source/drain regions 240 formed along laterally opposite sidewalls of gate electrode 202 and which extend beneath gate electrode 202 preferably by at least 50 Å. Source/drain regions 240 comprise a source/drain contact region 242 and the source/drain extension region 244. The source/drain contact regions 242 can include a low resistance silicide region 214, of for example cobalt silicide, and deposited heavily doped p-type silicon or silicon alloy. Additionally, the source/drain contact region 242 can include a deep high conductivity source/drain contacts formed by a high energy, high dose implant. Spacers 213 enable the formation of silicide 214 onto the source/drain contact regions 242 with a self-aligned process and provide an offset for the high energy high dose implant so that it does not overwhelm the precise dopant engineering of the extension regions. Such source/drain contact regions provide an extremely low contact resistance.

Source/drain regions 240 also include highly conductive source/drain extensions (SDE) 244 which comprise an overlap extension portion 248 and a raised extension portion 246. The overlap extension portion 248 is formed of selectively deposited heavily doped p-type silicon or a p-type silicon alloy such as p-type silicon germanium and are located beneath gate dielectric 202 beneath sidewalls spacer 210 and gate electrode 202.

The n-type region 206 located between the source/drain extensions 242 defines the channel region 250 of device 200. As shown in FIG. 2, the source/drain regions are formed with a recess etch which creates a source/drain extension geometry which concaves inward creating an inflection point 260. The inflection point 260 is the location where the source/drain regions extend the greatest lateral distance beneath of gate electrode 202. In this way, when the recesses are back filled with highly conductive silicon or silicon alloy the distance between the source/drain extension regions is larger directly beneath the gate dielectric than is the distance deeper into the n-type region. That is, in accordance with an embodiment of the present invention source/drain regions are formed in a manner which creates a channel region 252 directly beneath the gate dielectric with a larger physical or metallurgical channel length ($L_{met}$) than the channel region 254 deeper into the substrate between the inflection points 260. Such a unique geometry provides improved performance in both the "on" and "off" states of the device. When the device is "off", the channel region remains n-type (no inversion). In the off condition any leakage ($I_{off}$) is due to holes traveling from the source/drain extension region to the other source/drain extension region directly beneath the gate oxide in region 252. In the off condition, holes experience a large channel length which greatly reduces the leakage current (i.e., reduces $I_{off}$). On the other hand, when device 200 is in the "ON" condition, n-type region 206 forms a channel by inverting the n-type silicon into p-type silicon. The inversion region forms a channel deeper into the substrate than the depth at which the inflection point 260 occurs. In this way, when the device is in the "on" condition and the inverted channel formed, a smaller $L_{met}$ is realized. A smaller $L_{met}$ during the "ON" state directly translates to a smaller channel resistance which results in a higher $I_{on}$.

In an embodiment of the present invention, the deposited silicon or silicon alloy regions 212 have a maximum vertical depth of between 100–1500 Å below substrate surface 201 and extend horizontally (laterally) between 25–200 Å beneath gate electrode 202 at the channel/gate dielectric 204 interface, with the maximum lateral recess occurring at inflection point 260 which extends between 50–250 Å laterally beneath gate electrode 202 at a depth of between 25–100 Å below substrate surface 201. With the inwardly concaved source/drain extensions of the present invention a larger $L_{met}$ is achieved during the "OFF" state resulting in a lower $I_{off}$ while a smaller $L_{met}$ is realized during the "ON" state resulting in a higher $I_{on}$.

In an embodiment of the present invention MOS device 200 includes a source/drain extension having a raised portion 246. Extension region 246 is said to be raised because it includes a highly doped silicon or silicon alloy which extends above substrate surface 201 on which the gate dielectric 204 is formed. In an embodiment of the present invention the raised extension region 242 extends between 20–1000 Å above substrate surface 201. In an embodiment of the present invention raised extension portion 246 has a (311) facet 248. That is, in an embodiment of the present invention the silicon or silicon alloy 212 has a surface 248 adjacent to the sidewall spacers which angles away from the gate electrode with increased thickness. In an embodiment of the present invention the top surface or facet 248 adjacent to the gate electrode creates an angle between 50–75° with silicon surface 201. By creating facet 248 which angles away from gate electrode 202 the heavily doped raised source/drain extension 246 is spaced further from gate electrode edge. It is to be appreciated that the thickness and doping concentration level of the silicon or silicon alloy determines the resistivity of the extension portion of the fabricated transistor. A thicker and higher doped silicon or silicon alloy results in the transistor with the lower parasitic resistance. An adverse capacitance (i.e., miller capacitance), however, can develop when opposite voltages are placed on gate electrode 202 and silicon or silicon alloy 212 of source/drain region 240. The higher the doping and the greater the height the silicon or silicon alloy extends above surface 201, the greater is the Miller capacitance. Thus, by adding facet 248 the silicon or silicon alloy 212 is spaced further away from the gate electrode 202 which reduces the capacitance which enables thicker and higher doping of the silicon or silicon alloy regions 212. Introducing a facet 248 greatly reduces the fringing capacitance of the device.

In an embodiment of the present invention MOS transistor 200 includes a gate dielectric layer 204 which has a thicker portion 205 at the edges of the gate electrode 202 then at the center of the gate electrode 202. Increasing the thickness of the gate dielectric at the source/drain extension regions 248 improves robustness of the gate edge leakage. In an embodiment of the present invention gate dielectric 204 beneath the center of the gate electrode is between 5–30 Å thick with 8 Å being preferred while the portion 205 of the gate dielectric 204 beneath the edge the electrode is slightly thicker. In an embodiment of the present thicker gate dielectric portion 205 extends between 25–200 Å laterally beneath each side of gate electrode 202. Increasing the thickness of the gate dielectric at the edges of the gate electrode dramatically improves the robustness of the gate edge leakage.

It is to be appreciated that although a p-channel MOS device 200 has been described above one with ordinary skill in the art will appreciate that an n-MOS device with a similar structure can be formed by simply reversing the doping conductivity types of the P-MOS device. Additionally, it is appreciated that other features an elements of the present invention will become obvious from the method of fabrication described below.

The present invention will be described with respect the fabrication of a novel p-channel MOS (pMOS) device. One skilled in the art will appreciate the ability to form and n-channel MOS (nMOS) device in a similar manner except that the doping conductivity types are reversed.

Figure 3:
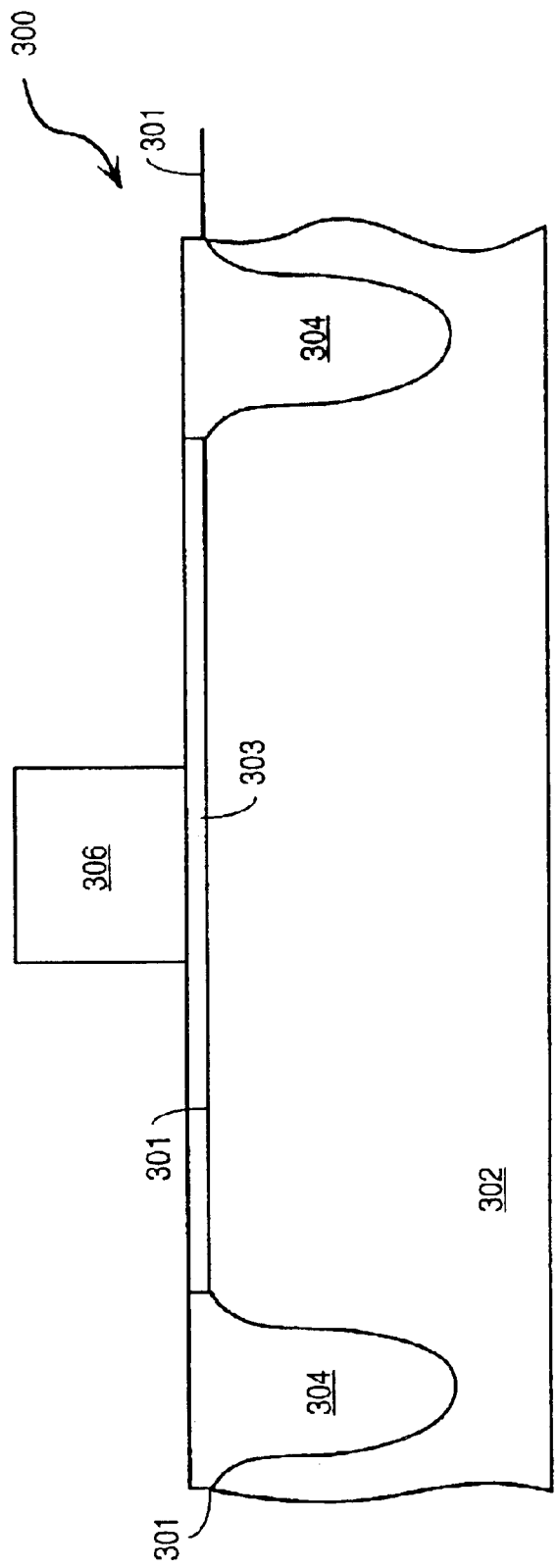
FIG. 3 is an illustration of a cross-sectional view of a substrate having a gate dielectric layer and a gate electrode.

FIG. 3 illustrates a substrate 300 which includes a partially fabricated p-type metal oxide semiconductor device (PMOS). Substrate 300 includes a plurality of field isolation regions 304 used to isolate wells of different conductivity types and to isolate adjacent transistors. Field isolation regions 304 are preferably shallow trench isolation (STI) regions formed by etching a trench into substrate 300 and then filling the trench with a deposited oxide. Although STI isolation regions are preferred because of their ability to be formed to small dimensions with a high degree of planarity, other methods can be used such as but not limited to local isolation of silicon (LOCOS), recessed LOCOS, or silicon on insulator (SOI), and suitable insulators, other than oxides, such as nitrides may be used if desired.

Silicon substrate 300 includes an n-type region 302 having a conductivity in the range of $1\times10^{17}/cm^3$–$1\times10^{19}/cm^3$ formed between isolation region, 304. According to a preferred embodiment the n-type conductivity region 302 is an n-well formed by a first implant of phosphorous atoms as a dose of $4\times10^{13}/cm^3$ at an energy of 475 keV, a second implant of phosphorous atoms at a dose of $2.5\times10^{12}/cm^3$ at an energy of 60 keV and a final implant of arsenic atoms at a does of $1\times10^{13}/cm^3$ at an energy of 180 keV into a silicon substrate 300 having a concentration of $1\times10^{16}/cm^3$ in order to produce an n-well 302 having an n-type concentration of approximately $7.0\times10^{17}/cm^3$. It is to be appreciated that n-type conductivity region 302 may be formed by other means including providing initially doped substrate, or depositing an insitu doped semiconductor material with a desired conductivity. According to the present invention a substrate is defined as a starting material on which the transistor of the present invention is fabricated and in embodiment includes n-well 302.

A gate dielectric layer 303 is formed on the top surface 301 of substrate 300 is shown in FIG. 3. Gate dielectric layer 303 is preferably a nitride oxide layer formed to a thickness between 5–30 Å with 8 Å being preferred. It is to be appreciated other well known gate dielectric layers such as oxides, nitrides, and combination thereof may be utilized if desired. A gate electrode 306 is formed on gate dielectric layer 303 formed on n-well 302. Gate electrode 306 is preferably formed from a 1000–3500 Å thick layer of blanket deposited polysilicon pattern into a gate electrode 306 with well known photolithographic techniques. If desired the polysilicon layer can be ion implanted or insitu doped to the desired conductivity type and level prior to patterning. It is to be appreciated that other well known patterning techniques may be utilized to pattern the polysilicon layer into gate electrode 306 including submicron lithography techniques, such as e-beam and x-ray, and subphotolithographic patterning techniques such as described in U.S. Pat. No. 5,434,093 entitled "Inverted Spacer Transistor" and assigned to the present Assignee. According to the preferred method of the present invention polysilicon gate electrode 306 has a drawn length down to 50 nm (500 Å). Additionally, although gate electrode 306 is preferably a polysilicon electrode, gate electrode 306 can be but not limited to metal gates, a single crystalline silicon gate, or any combinations thereof if desired.

Figure 4:
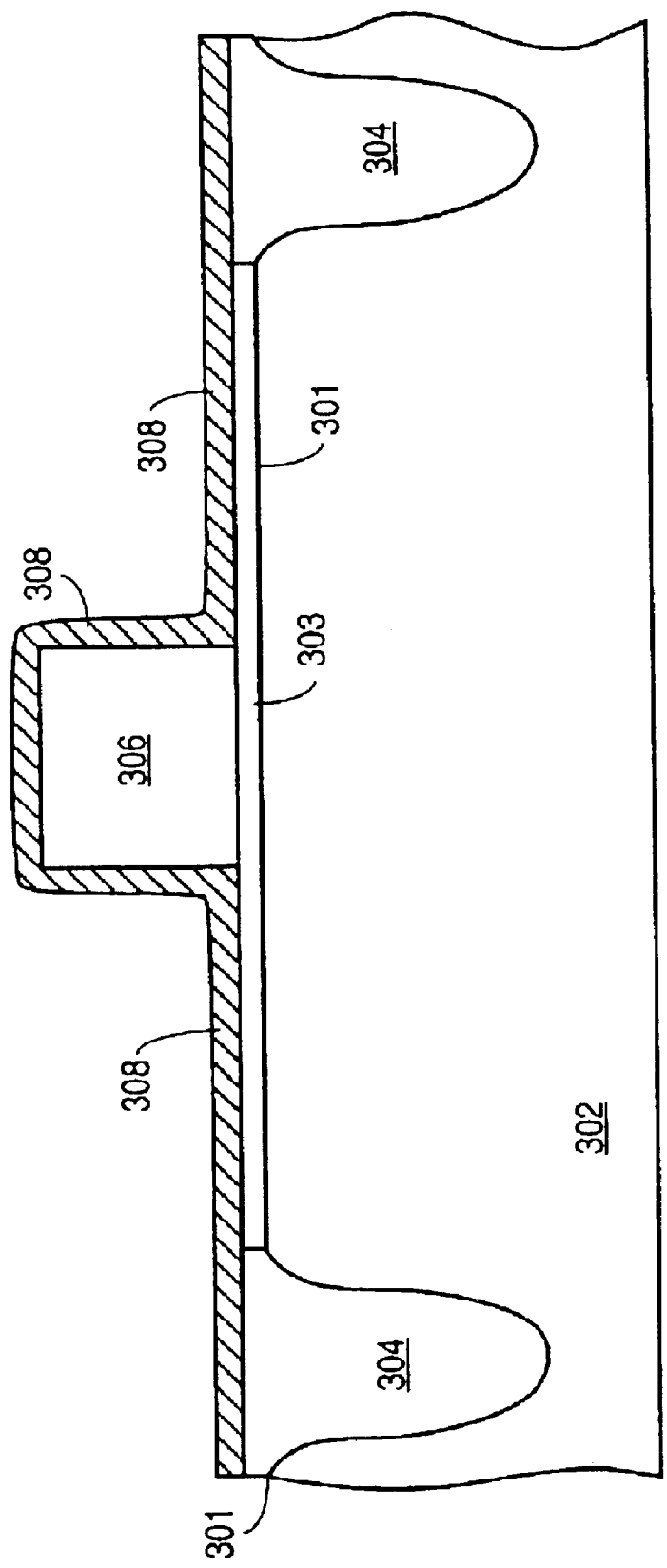
FIG. 4 is an illustration of a cross-sectional view showing the formation of a spacer material on the substrate of FIG. 3.

According to the present invention a thin spacer layer 308 is formed over substrate 300 including n-well 302 and the top and sides of gate electrode 306 as shown in FIG. 4. Spacer layer 308 will subsequently be used to form sidewall spacers for the MOS device. Spacer layer 310 is formed to a thickness between 50–300 Å. It is to be appreciated that spacer layer 308 must be formed thick enough to electrically isolate a subsequently deposited silicon or silicon alloy film from gate electrode 306.

Spacer layer 308 is preferably silicon nitride film formed by a "hotwall" process to achieve a hermetic seal of gate electrode 306 and the edges of gate dielectric 303. By forming a silicon nitride spacer layer 308 directly on the gate electrode 306 a hermetic seal is formed and hot electron lifetime of the fabricated transistors dramatically improved. A silicon nitride layer 308 can be formed by a low pressure chemical vapor deposition (LPCVD) process by reacting ammonia ($NH_3$) and dichlorosilane (DCS) at a pressure of approximately 10 pascals and at a temperature of approximately 80° C. Although a hot wall silicon nitride layer is preferred in the present invention because of the hermetic seal it forms, any other suitable insulating layer, such as a deposited oxide or a composite oxide/silicon nitride film, can be used if desired.

Figure 5:
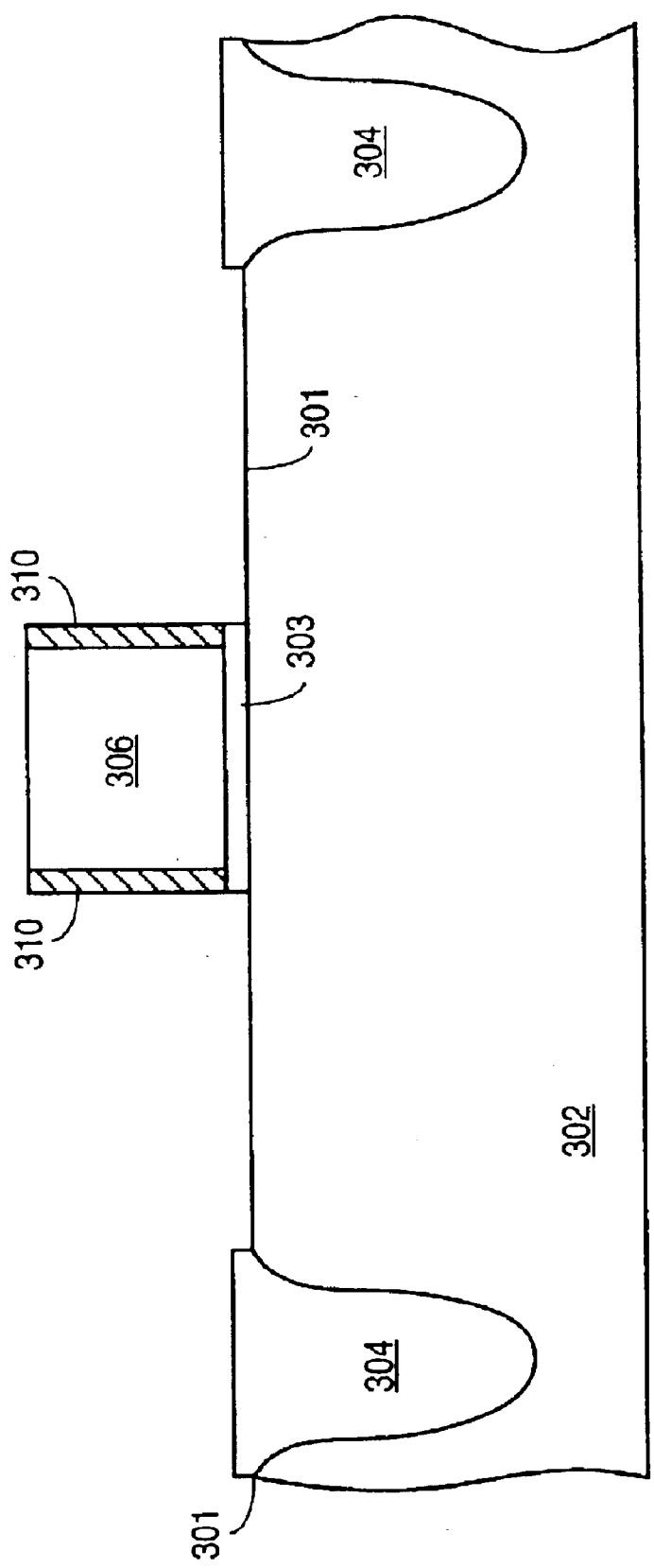
FIG. 5 is an illustration of a cross-sectional view showing the formation of spacers from the spacer layer on the substrate of FIG. 4.

Next, as shown in FIG. 5, spacer layer 308 is anisotropically dry etched to form a pair of thin sidewall spacers 310 which run along laterally opposite sidewalls of gate electrode 306. According to an embodiment of the present invention silicon nitride spacers 316 are formed by anisotropically plasma etching a silicon nitride spacer layer 308 using chemistry comprising $C_2F_6$ and a power of approximately 300 watts. The anisotropic etch is continued until all of the spacer material has been removed from the substrate surface 301 and from the top of gate electrode 306. Any remaining gate oxide layer 303 on the source/drain regions is also removed at this time. In a preferred embodiment of the present invention sidewall spacers having a thickness of between 50–300 Å are formed.

Figure 6:
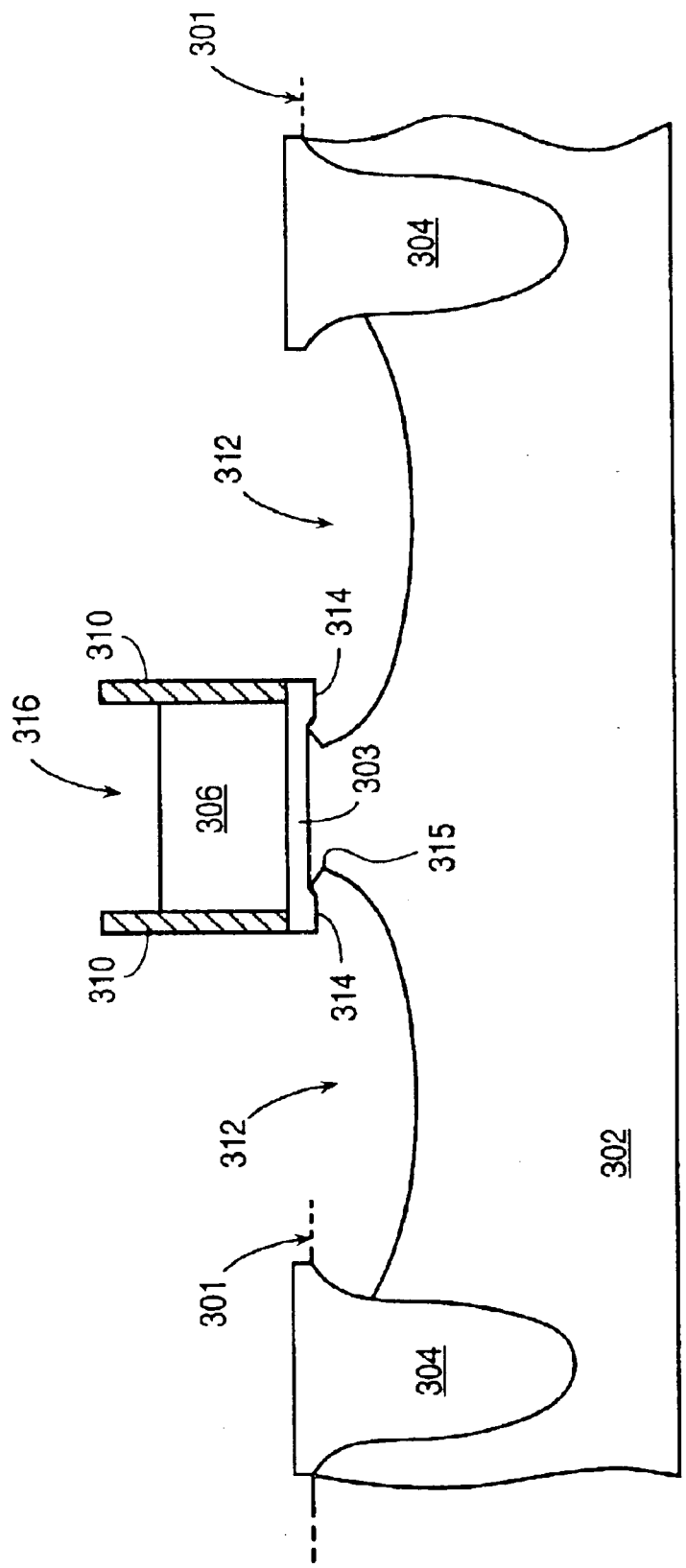
FIG. 6 is an illustration of a cross-sectional view showing the formation of recesses in the substrate of FIG. 5.

Next, as shown in FIG. 6, recesses 312 are formed is substrate 300 along laterally opposite sidewalls of gate electrode 306. In a preferred embodiment of the present invention an "isotropic" etch process is used to form lateral recess 312 as illustrated in FIG. 6. An isotropic etch not only etches vertically into the substrate but also etches horizontally (laterally) beneath the sidewall spacers 310 and gate electrode 306. Such as lateral recess etch can be produced by using an "isotropic" dry etch process in a parallel plate RF plasma etching system using a gas mix chemistry comprising $SF_6$ and helium (He) and process conditions which favor isotropy, such as high pressure and low RF power density. In one embodiment of the present invention, a process pressure of approximately 900 mT, a gap of 1.1 cm, an RF power of 100 W, a He flow of 150 sccm, and a $SF_6$ flow of 100 sccm is used. RF power may be varied in a range, for example, of 50 W to 200 W, and the process pressure may be varied but should be greater than approximately 500 mT.

Not only does such an etching process produce lateral recesses but the etch chemistry is highly selective to the gate oxide and to the thin nitride spacer material. In this way the spacers 310 and gate dielectric 303 are not etched during the silicon etch and the integrity of the thin nitride spacers 310 and gate dielectric 303 preserved.

Another advantage of the etch process used to form the lateral recess is that the etch chemistry is slightly oxidizing. Utilizing an oxidizing etchant causes the portion 314 of the gate oxide layer 303 exposed during the recess etch to become thicker than the unexposed portion of the oxide layer. By increasing the thickness of the gate oxide layer at the edge of the gate electrode, the gate edge leakage at the tip overlap region of the device is reduced. Additionally, a thicker gate dielectric layer at the gate edge helps to increase the breakdown voltage of the device.

Yet another advantage of the lateral recess etch process of the present invention is that the etch rate can be made slow, between 5–30 Å per second, which causes the etch of the silicon substrate to concave inwards and form an inflection point 315 as shown in FIG. 6. With this geometry, a large $L_{met}$ (metallurgical channel length or physical channel length) is achieved during the off state (low $I_{off}$) while a smaller $L_{met}$ is realized during the on state when the channel is formed. A smaller $L_{met}$ during the on state directly translates to a smaller channel resistance and enhance a higher $I_{on}$. Although a dry etch is preferred in the present invention a wet etch can also be used if desired.

In an embodiment of the present invention recesses 312 have a maximum vertical depth of between 100–1500 Å below substrate surface 301 and extend between 25–200 Å horizontally or laterally beneath gate electrode 306 at the channel/gate dielectric interface with a maximum lateral recess occurring at the inflection point 315 which extends between 50–250 Å laterally beneath the edge of gate electrode 306 at a depth of between 25–100 Å below substrate surface 301. It is to be appreciated that alternative process conditions and chemistries may be utilized to generate a recess with any desired geometry. Additionally, it is to be noted that the recess etch also etches away the top portion 316 of the silicon gate electrode 306 as shown in FIG. 6.

In an alternative embodiment of the present invention, an anisotropic etch is used to form recesses 312 which are etched only in the vertical direction into the substrate and which do not extend laterally beneath the sidewall spacers 310 in gate electrode 306. In an embodiment of the present invention, silicon nitride spacers 310 and recesses 312 are formed "insitu" using a chemistry comprising of $C_2F_6$ to both etch the spacers and the recesses. If vertical recesses are formed then an anneal may be necessary to drive dopants from subsequently deposited silicon or silicon alloy source/drain regions to beneath the gate electrode.

Figure 7:
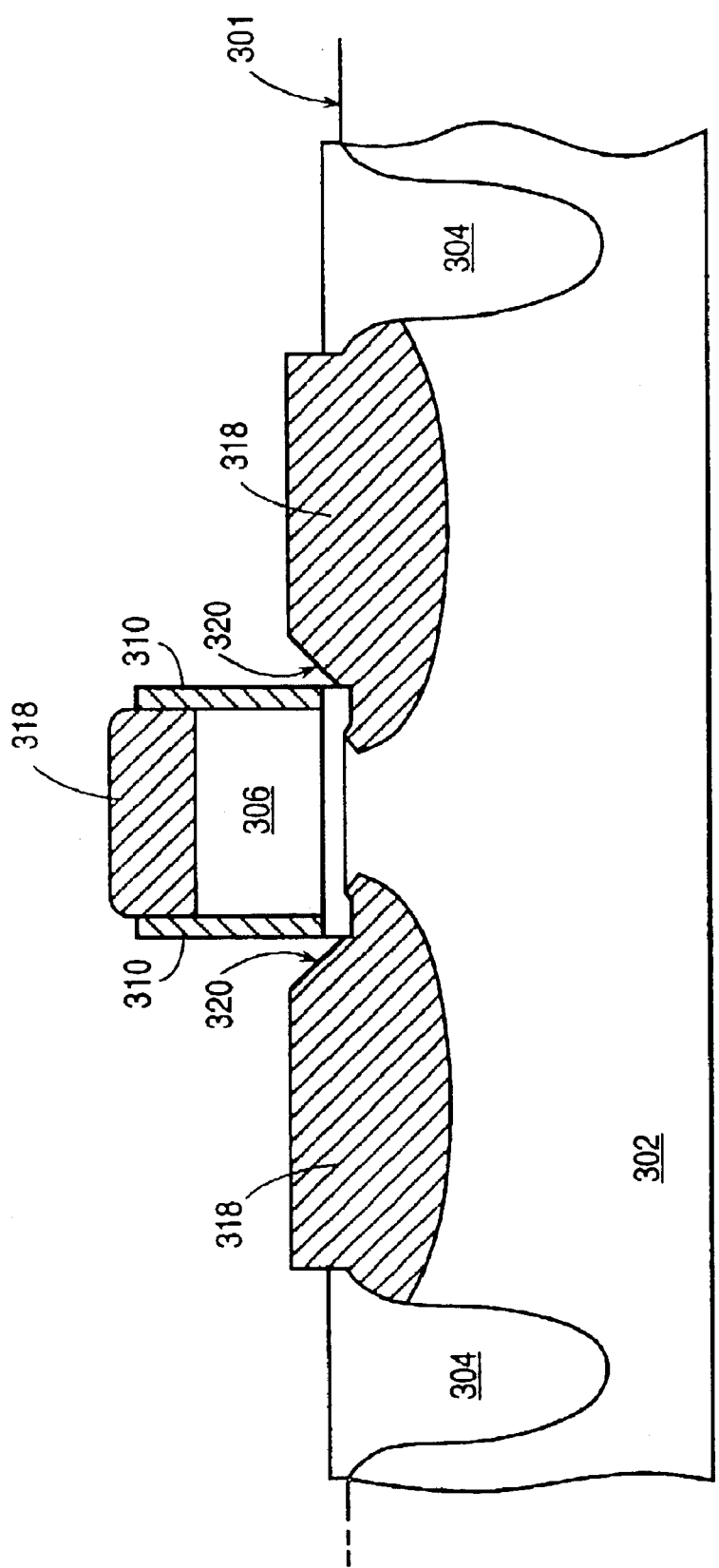
FIG. 7 is an illustration of a cross-sectional view showing the formation of a silicon or silicon alloy in the recesses in the substrate of FIG. 6.

Next, the recesses are filled with a deposited silicon or silicon alloy 318 such as silicon germanium ($Si_xGe_{100-x}$) as shown in FIG. 7. In an embodiment of the present invention an insitu doped silicon germanium alloy having between 10–50 atomic percent germanium is selectively deposited into recess 312 and onto the top gate electrode 306. Silicon or silicon germanium alloy 318 is selectively deposited so that it forms only on exposed silicon, such as on n-well 302, in recesses 312 and the top of polysilicon gate electrode 306 and not on dielectric regions such as silicon nitride spacers 310 and isolation regions 304. The silicon or silicon alloy 318 is insitu doped with p-type impurities to a concentration level between $1\times10^{18}/cm^3$–$3\times10^{21}/cm^3$ with a concentration of approximately $1\times10^{21}/cm^3$ being preferred. Silicon nitride spacers 310 electrically isolate silicon or silicon alloy 318 formed in recesses 312 from gate electrode 306. Silicon or silicon alloy 318 is formed to a thickness of between 200–2000 Å with approximately 500 Å being preferred. In this way the silicon or silicon alloy 318 is formed both above and below surface 301 of semiconductor substrate 300. By forming silicon or silicon alloy 318 above substrate surface 301, a "raised" extension is formed which increases the conductivity of the tip which in turns improves device performance. By forming raised extension regions in the present invention, shallow extensions or tips can be formed and good punchthrough characteristics obtained.

According to an embodiment of the present invention, a silicon germanium alloy 318 is formed by a decomposition of approximately 20 sccm of dichlorosilane ($SiH_2Cl_2$) approximately 50–180 sccm of one percent hydrogen diluted germanium ($GeH_4$) and a p-type dopant source of approximately 5–100 sccm of one percent hydrogen diluted diborane $B_2H_6$ at a temperature of between 600°–800° C. with 700° C. being preferred and the pressure of approximately 10–200 torrs with 165 torr being preferred. In order to increase the selectivity of the deposition process, approximately 5–60 sccm of HCl can be added to the gas composition if desired. A silicon germanium alloy exhibits good selectivity to silicon during deposition. Additionally, such a silicon germanium semiconductor alloy exhibits many microscopic "faults" and "dislocation" which aid in the solid state diffusion of dopants through the silicon germanium alloy. In another embodiment of the present invention a p-type silicon film 318 is formed. A p-type silicon film can be selectively deposited at a temperature of approximately 800° C., with approximately 20 slm $H_2$, approximately 70 sccm HCl, approximately 120 sccm $SiH_2Cl_2$, and approximately 75 sccm $B_2H_6$. Such process conditions can deposit a layer approximately 50 nm thick in approximately 155 seconds.

In an embodiment of the present invention the majority of the boron dopants added during the silicon a silicon alloy film deposition are not activated at this time. That is, after deposition boron atoms are present in the silicon film but have not yet substituted into silicon sites in the lattice where they can provide a hole (lack of an electron). In an embodiment of the present invention thermal activation of the dopants is deferred until during the conversion anneal of the salicide process. In this way dopant diffusion is reduced due to a reduction in the thermal budget which enables a very abrupt source/drain junction to be formed which dramatically improves device performance.

In an embodiment of the present invention as illustrated in FIG. 7, the silicon or silicon alloy 318 is deposited so that a (311) facet 320 is introduced during deposition. It is to be appreciated that the thickness and doping concentration level of the silicon germanium alloy 318 determines the resistivity of the extension portion of the fabricated pMOS transistor. A thicker and higher doped silicon or silicon alloy results in a transistor with a lower parasitic resistance. An adverse capacitance (i.e., miller capacitance), however, can develop when opposite voltages are placed on gate electrode 306 and silicon or silicon alloy source/drain regions 318. The higher the doping and the greater the thickness of the silicon or silicon alloy 318 extends above surface 301, the greater is the Miller capacitance. Thus, by adding facet 320 during deposition, the silicon or silicon alloy 318 is spaced further away from the gate electrode which reduces the capacitance and which enables thicker and higher doping of the silicon or silicon alloy regions 318 to be utilized.

Figure 8:
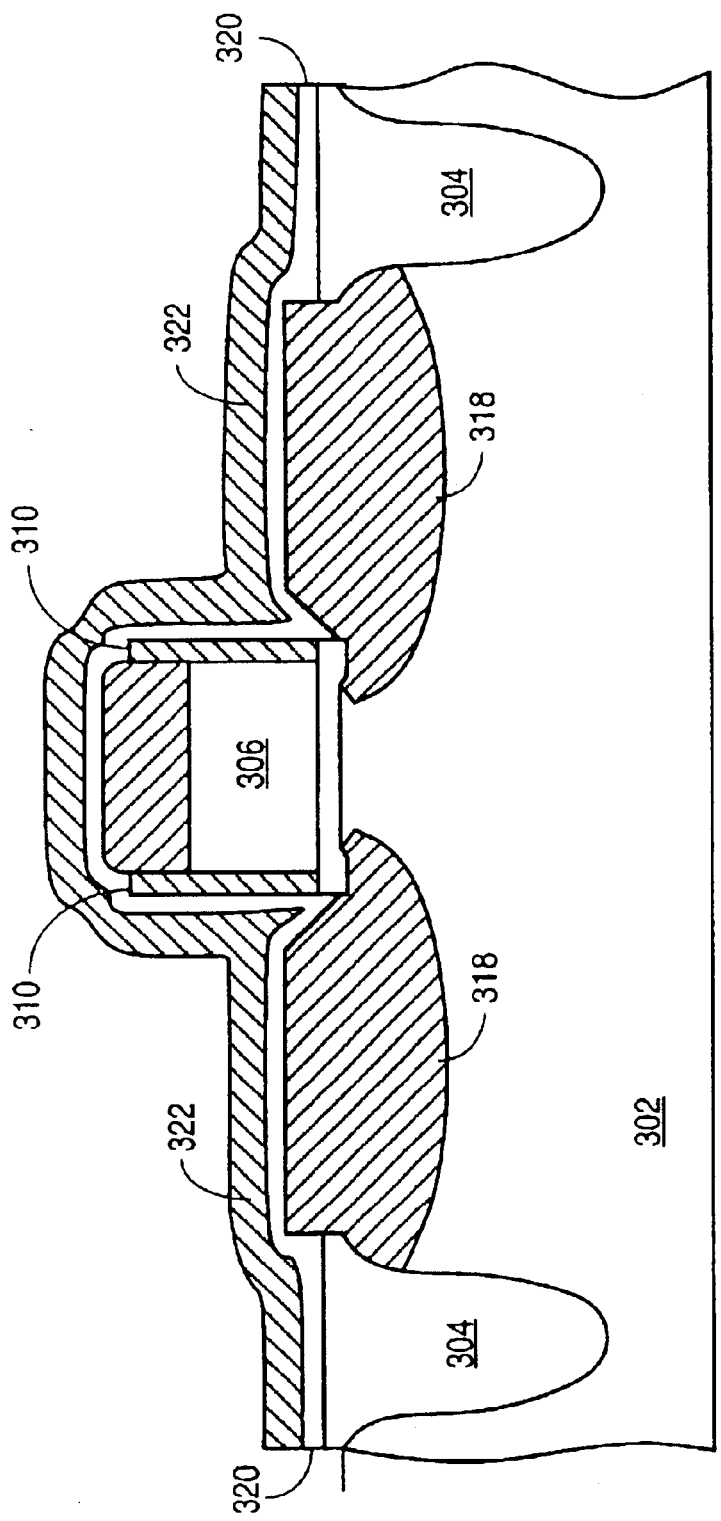
FIG. 8 is an illustration of a cross-sectional view showing the formation of a thin oxide layer and a silicon nitride layer on the substrate of FIG. 7.

Next, as shown in FIG. 8, a thin, approximately 50–100 Å chemical vapor deposited (CVD) oxide layer 322 is blanket deposited over substrate 300 including silicon or silicon alloy film 318, sidewall spacers 310 and isolation regions 304. Oxide layer 322 can be formed by any well known CVD process. In a preferred embodiment however the deposition temperature is kept below 750° C. in order to not activate or disturb the dopants in the silicon or silicon alloy. An oxide deposition temperature of approximately 650° C. is preferred. Next, a substantially thicker, 500 to 1800 Å with 800 Å, CVD silicon nitride layer 324 is blanket deposited onto oxide layer 322. Silicon nitride layer 324 is preferably formed by a standard CVD "hot wall" process at a temperature below 750° C and a temperature of 750° being ideal. By keeping the silicon nitride deposition temperature relatively low the thermal budget is kept down and the deposition rate and uniformity made more controllable. Oxide layer 322 buffers the large stress inherent silicon nitride layer 324 and provides an etch step for silicon nitride layer 324 during a subsequent spacer etch.

Figure 9:
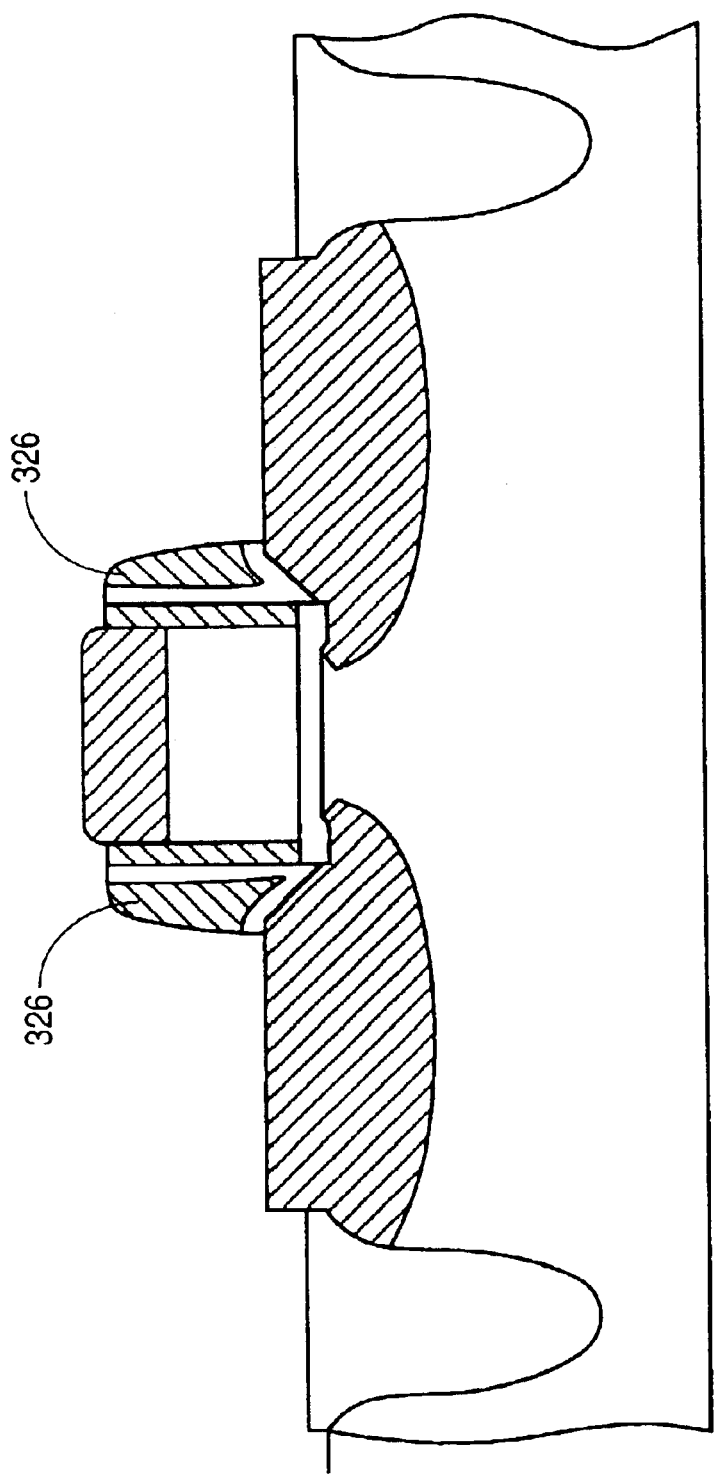
FIG. 9 is an illustration of a cross-sectional view showing the formation of a second pair of sidewall spacers on the substrate of FIG. 8.

Next, silicon nitride layer 324, and oxide layer 322, are anisotropically etched to form a pair of composite spacers 326 adjacent to the first pair of silicon nitride spacers 310 as shown in FIG. 9. Any well known silicon nitride and oxide etchant process may be used to anisotropically etch silicon nitride layer 324 and buffer oxide layer 322. Additionally, it is to be appreciated that although composite spacers are utilized a single nitride or oxide layer can be used to form spacers 326 if desired. Spacers 326 are used to separate a silicide on the source/drain regions from a silicide on the gate region and/or to offset a high energy high dose implant from the active channel region. In an embodiment of the present invention spacers 326 have a thickness between 500–2000 Å.

Figure 10:
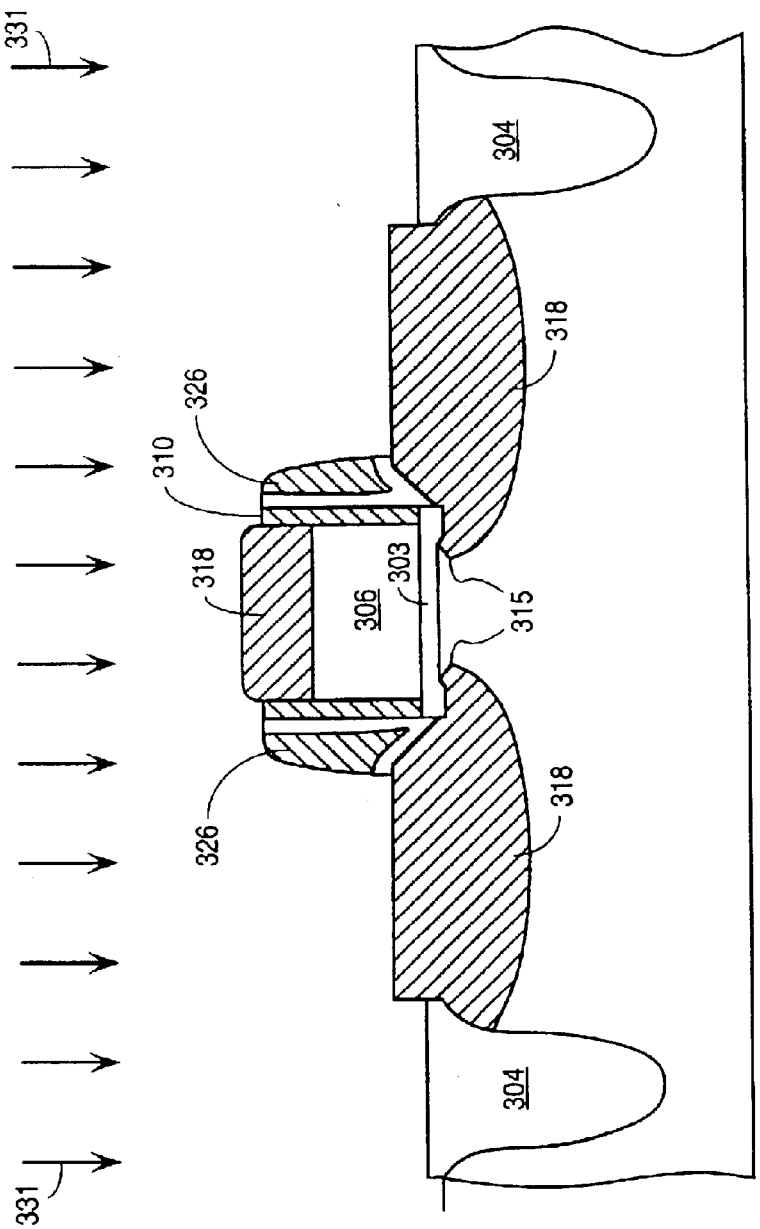
FIG. 10 is an illustration of a cross-sectional view showing the formation of high energy deep source/drain implants into the substrate of FIG. 9.

Next, as shown in FIG. 10 if desired a high energy deep source/drain implant can be made at this time into substrate 300. The high concentration p-type implant 331 is made into silicon or silicon alloy 318 in alignment with the outside edges of composite spacers 326 in order to further increase the doping concentration level and depth of the source/drain contact regions of the pMOS transistors and the gate electrode 306. Spacers 326 and 310 and gate electrode 306 prevent doping of the channel region beneath the gate as well as the silicon or silicon alloy film lying beneath the spacers. In this way heavy source/drain implant does not interfere or overwhelm the doping profile of the source/drain extensions.

Next, a salicidation process is utilized to form a low resistance silicide on the deposited silicon or silicon alloy 318 in the source/drain regions and on the top of the gate electrode 306.

According to a preferred embodiment of the present invention a cobalt silicide film is formed on silicon germanium source/drain regions 318 and onto silicon germanium on gate electrode 306. According to the preferred salicidation process of the present invention, a cobalt film 332 is blanket deposited over substrate 300 as shown in FIG. 11.

The cobalt film 332 is directly deposited onto the silicon germanium alloy 318 in the source/drain regions, over the thick sidewall spacers 326, over the top of the thin sidewall spacers 310, on the silicon germanium alloy 318 on the top of the gate electrode 306 as well as onto isolation regions 304. In an embodiment of the present invention a cobalt film is deposited to a thickness of between 100–200 Å. A cobalt film can be formed by any well known method including sputter deposition or chemical vapor deposition. An Applied Materials Endura system can be used to sputter deposit a cobalt film.

Figure 11:
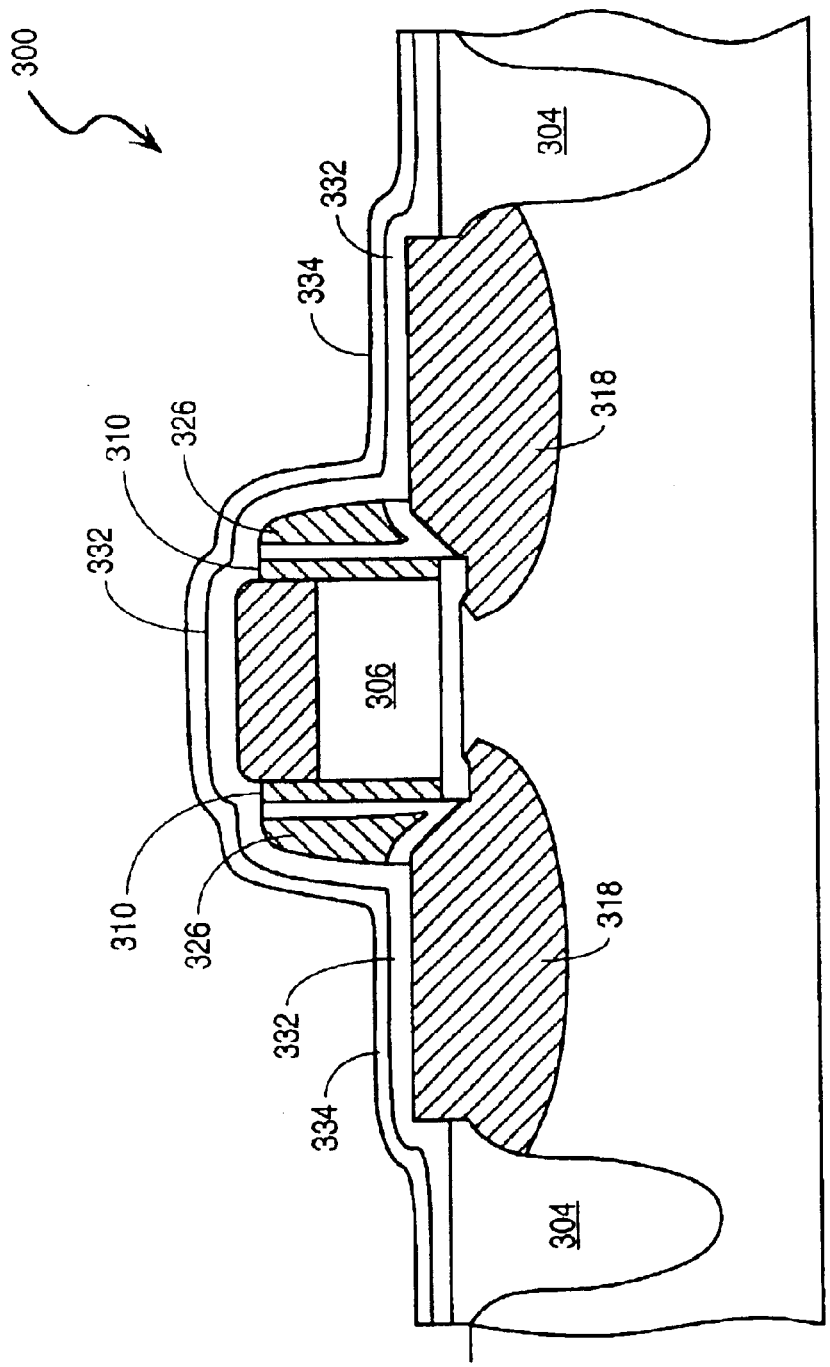
FIG. 11 is an illustration of a cross-sectional view showing the formation of a cobalt film over the substrate of FIG. 10.

Next, as also shown in FIG. 11, a capping layer 334, of for example titanium nitride, is deposited directly onto cobalt film 332. In an embodiment of the present invention the capping layer is titanium nitride formed to a thickness of between 50–200 Å. Titanium nitride capping layer 334 can be formed by any well known technique such as by sputter deposition utilizing an Applied Materials Endura system or can be deposited by chemical vapor deposition. Capping layer 334 protects the underlying cobalt layer 332 from oxidation during a subsequent silicide anneal.

Figure 12:
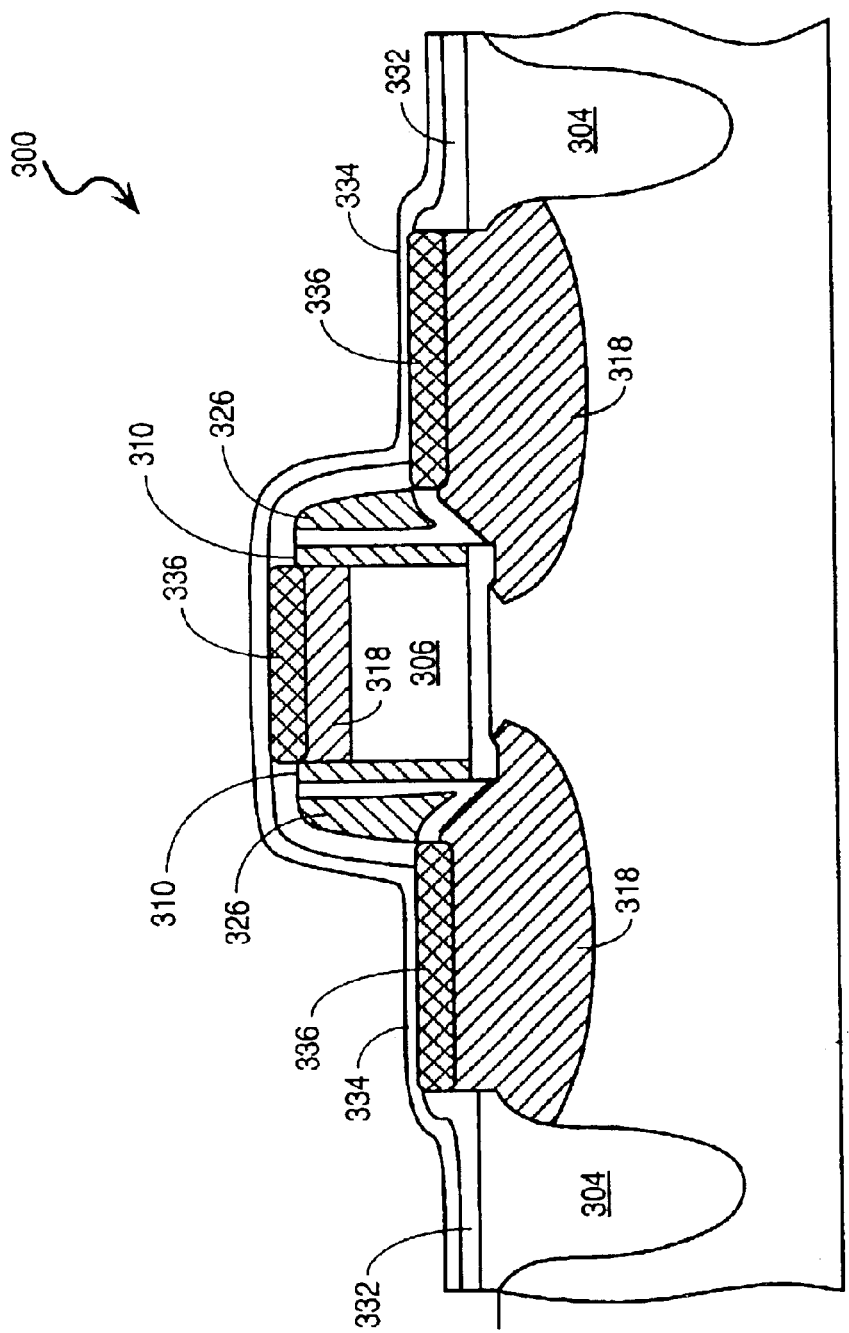
FIG. 12 is an illustration of a cross-sectional view showing the formation of a monocobaltgermanosilicide film on the substrate of FIG. 11.

Next, substrate 300 is heated to a temperature and for a period of time sufficient to cause the cobalt film to react with any underlying silicon or silicon alloy to form a monocobaltgermanosilicide film Co ($Si_xGe_{100-x}$) as shown in FIG. 12. Monocobaltgermanosilicide is formed at all locations where silicon germanium 318 is available to react with the cobalt. Cobalt remains unreacted at locations where no silicon germanium or silicon is available for reactions such as dielectric spacers 326 and 310 and dielectric isolation region 304. In order to react cobalt with silicon germanium in order to form the monocobaltgermano silicide phase, substrate 300 can be heated in an inert ambient, such as $N_2$, to a temperature between 400–500° C. with about 460° C. being preferred for a period of time between 45–120 seconds with 90 seconds being preferred. Substrate 300 can be suitably annealed in an AMAT 5000 or 5200 RTP processor. Such a heating step causes the reaction of cobalt and silicon germanium to form a monocobaltgermanosilicide phase film 336 having a mean sheet resistance of between 11–14 ohms per square.

Figure 13:
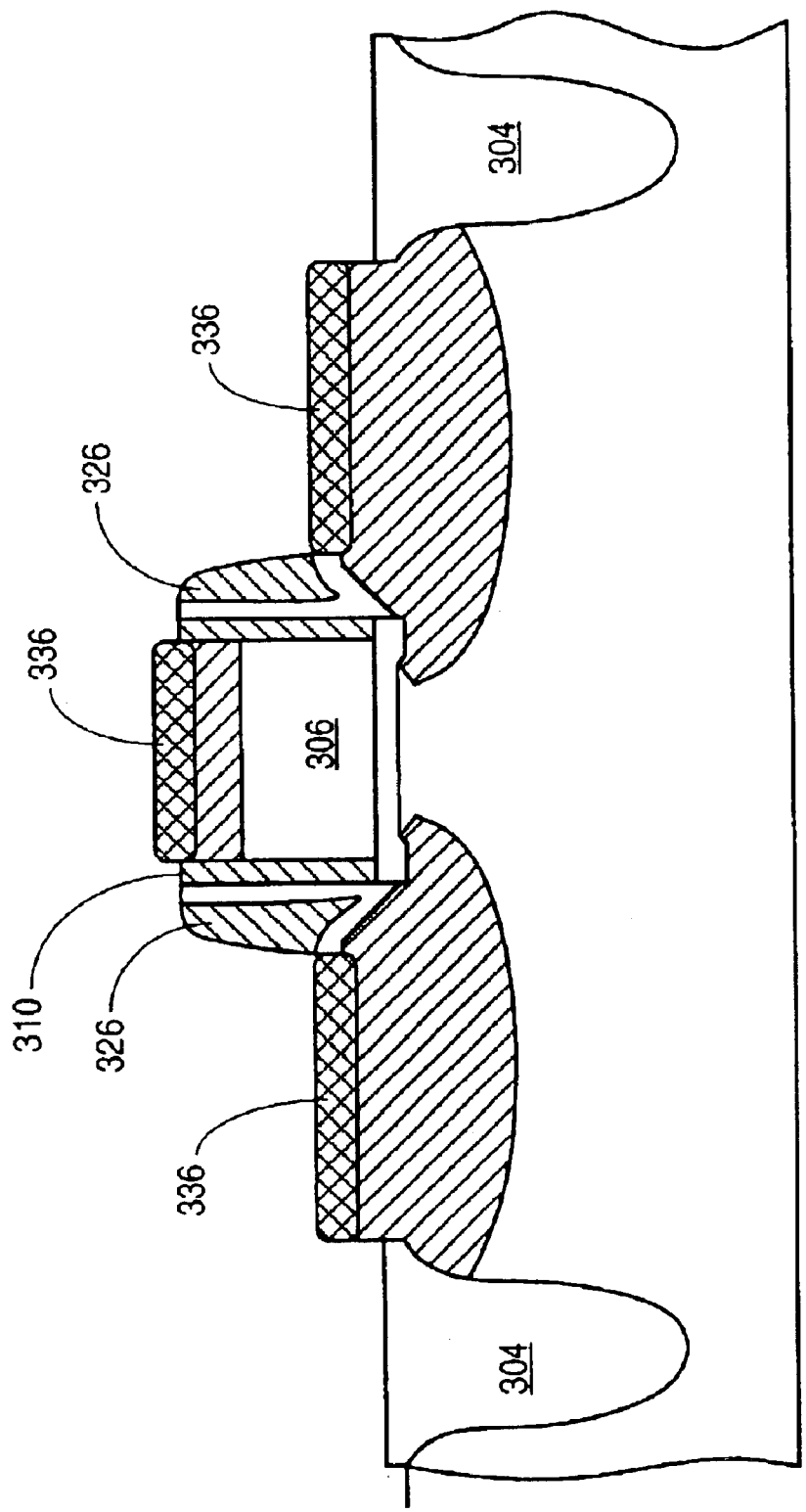
FIG. 13 is an illustration of a cross-sectional view showing the removal of unreacted cobalt from the substrate of FIG. 12.

Next, unreacted cobalt 332 (and the over lying titanium nitride capping layer 334) on the spacers and isolation regions is removed while leaving the formed monocobaltgermanosilicide film 336 as shown in FIG. 13. Unreacted cobalt 332 can be removed without removing monocobaltgermanosilicide 336 by exposing substrate 300 to a 50:1 buffered HF wet etch for between 90–150 seconds with 120 seconds being preferred. After the wet etch, monocobaltgermanosilicide 336 remains on the source/drain regions and on the gate electrode 306 and are electrically isolated from one another by the spacers 326 and isolation regions 304. After the wet etch, the resistance of the monocobaltgermano silicide film 336 increases to between 50–90 ohms per square.

Figure 14:
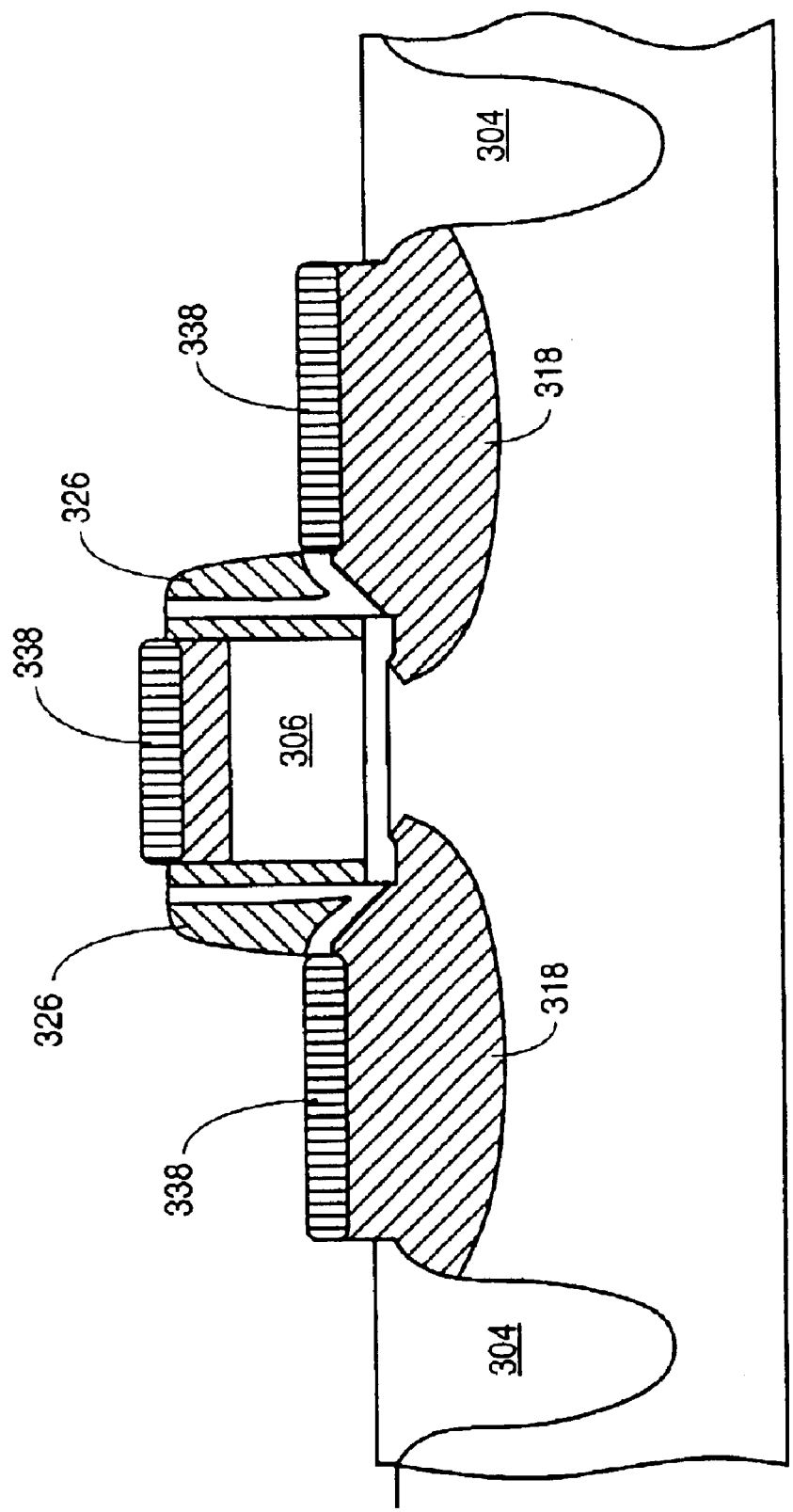
FIG. 14 is an illustration of a cross-sectional view showing the conversion of the monocobaltgermanosilicide $Co(Si_xGe_{100-x})$ film on the substrate of FIG. 13 into a cobaltdigermanosilcide $Co(Si_xGe_{100-x})_2$ film.

Next, as shown in FIG. 14, substrate 300 is heated to cause the monocobaltgermano Co ($Si_xGe_{100-x}$) silicide phase film 336 to convert into the low sheet resistance cobaltdigermanosilicide Co ($Si_xGe_{100-x}$)$_2$ phase 338. According to the present invention a non-equalibrium rapid thermal anneal is utilized to convert or transform the monocobaltgermanosilicide Co ($Si_xGe_{100-x}$) phase into the cobaltdigermanosilicide Co ($Si_xGe_{100-x}$)$_2$ phase. According to the present invention substrate 300 is heated in an inert ambient such as $N_2$ to a relatively high temperature of greater than 850° C. and preferably greater than 920° C. for a relatively short period of time, of less than 20 seconds and preferably less than 15 seconds and ideally less than 10 seconds. The non-equilibrium conversion anneal of the present invention can be accomplished in an AMAT 5000 or 5200 rapid thermal processor. The relatively high temperature short duration non-equalibrium anneal of the present invention prevents germanium rejection from the phase system. That is, since the conversion anneal occurs in relatively short period of time, germanium is not given a sufficient time to separate out of the silicon germanium alloy to form precipitates at the grain boundaries. By keeping the conversion anneal time short germanium rejection is suppressed leaving germanium homogeneously spread throughout the film. By preventing germanium rejection a homogeneous cobaltdi-germaniumsilicide film 338 having a resistivity of between 2–5 ohms/square can be formed.

Additionally, in an embodiment of the present invention substrate 300 has not been subjected to any activation or drive anneals prior to the non equalibrium conversion anneal of the present invention. In this way the non-equalibrium conversion anneal is the anneal which activates the dopants in the silicon or silicon alloy as well as any dopants implanted during the source/drain implant. That is, in an embodiment of the present invention the non equalibrium conversion anneal is used to thermally activate the insitu deposited and implanted boron atoms by causing them to occupy silicon sites in the lattice so they can be electrically active. At this point the fabrication of a novel transistor having a inwardly concaved source/drain region, a thicker gate oxide at the gate edge and a raised source/drain region with a facet is complete.

FIG. 15 illustrates an alternative embodiment 500 of the pMOS device 200 shown in FIG. 2. Device 500 has the same structure and is manufactured similarly to device 200 except that it contains a thin, between 25–100 Å thick n-type silicon or silicon alloy 502 formed in the bottom of the recesses prior to forming the p-type silicon or silicon alloy 212. The n-type silicon or silicon alloy has an n-type concentration greater than the concentration of the n-type region 206. In an embodiment of the present invention the n-type silicon or silicon alloy 502 is doped to a concentration level between $5 \times 10^{18} – 1 \times 10^{20}$ atoms/cm$^3$. Inclusion of the n-type silicon film 502 in the bottom of the recesses provides a highly localized halo region which improves the punchthrough performance of the device.

Although the transistor of the present invention has been described with respect to the fabrication of a p-MOS device having a specific structure, it is to be appreciated that the present invention can be used to form an nMOS device. An n-MOS device can be formed by the above described process except that the recesses are formed in a p-type substrate region having a conductivity in the range of $1 \times 10^{17}/cm^3 – 1 \times 10^9/cm^3$ and are filled with an n-type silicon or silicon alloy having a doping density between $1 \times 10^{18}/cm^3 – 3 \times 10^{21}/cm^3$ with a concentration of approximately $1 \times 10^{20}/cm^3$ being preferred. An n-type silicon germanium alloy can be formed by decomposition of approximately 20–250 sccm with preferably 200 sccm of dichlorosilane (SiH$_2$Cl$_2$), approximately 25–200 with preferably 50 sccm of 1% hydrogen diluted germanium (GeH$_4$) and an n-type dopant source of approximately 100–400 sccm with preferably 200 sccm hydrogen diluted phosphane (PH$_3$) at a temperature between 500°–700° C., with 575° C. being preferred, and at preferably atmospheric pressure. In order to increase the selectivity of the deposition process approximately 5–60 sccm of HCl can be added to the gas composition if desired. Alternatively an n-type silicon film can be formed in the recess. An n-type type silicon film can be selectively deposited at a temperature of approximately 575° C., with approximately 10 µm H$_2$, approximately 0–30 sccm HCl, approximately 200 sccm SiH$_2$Cl$_2$, and approximately 200 sccm PH$_3$, at approximately atmospheric pressure. Additionally, if desired a localized halo region can be included in the nMOS device by forming a thin p-type silicon or silicon alloy prior to forming the n-type silicon or silicon alloy.

Thus, a novel transistor and its method of fabrication has been described.

We claim:

1. A method of forming an device comprising:

forming a gate dielectric on a first conductivity type region;

forming a gate electrode on said gate dielectric;

forming a pair of sidewall spacers along laterally opposite sidewalls of said gate electrode; and forming a pair of recesses on opposite sides of said gate electrode;

depositing a silicon or silicon alloy into said pair of recesses to form a pair of source/drain regions of a second conductivity type in said substrate on opposite sides of said gate electrode, wherein said silicon or silicon alloy source/drain regions extend beneath the gate electrode and define a channel region beneath said gate electrode in said first conductivity type region wherein said channel region directly beneath the gate electrode is large than said channel region deeper into said first conductivity type region.

2. The method of claim 1 further comprising:

depositing said silicon or silicon alloy above said gate dielectric such that the top surface of said silicon or silicon alloy is spaced further from said gate electrode then the silicon or silicon alloy adjacent to said gate dielectric.

3. The method of forming an MOS device at claim 1 further comprising:

making the outside edge of said gate dielectric beneath said gate electrode thicker than the gate dielectric beneath the center of said gate electrode.

4. A method of forming a transistor comprising:

forming a gate dielectric layer on a first surface of a first conductivity type region of a substrate;

forming a gate electrode having laterally opposite sidewalls on said gate dielectric;

forming a pair of sidewall spacers along laterally opposite sidewalls of said gate electrode;

etching a pair of recesses in said substrate on opposite sides of said gate electrode wherein said etching of said substrate forms a pair of recesses having an inflection point beneath said gate electrode; and depositing a silicon or silicon alloy film into said pair of recesses.

5. The method of claim 4, wherein said etching of said recesses exposes a portion of said gate dielectric layer beneath the outside edges of said gate electrode.

6. The method of claim 4 further comprising oxidizing said exposed portion of said gate dielectric layer to increase the thickness of said exposed portions of said gate dielectric layer.

7. The method of claim 4 further comprising etching said recess to expose a portion of said gate dielectric layer beneath the outside edges of said gate electrode and wherein said etching oxidizes said exposed portion of said gate dielectric layer to increase the thickness of said exposed portion of said gate dielectric layer.

8. The method of claim 4 wherein said etching utilizes an isotropic dry etching process.

9. The method of claim 8 wherein said etching comprises SF6 and He.

10. The method of claim 4 further comprising depositing said silicon or silicon alloy film above said first surface of said semiconductor substrate.

11. The method of claim 10 wherein said silicon or silicon alloy film is deposited above said first surface of said semiconductor substrate such that the top surface of said deposited silicon or silicon alloy is spaced further from said gate electrode than the silicon or silicon alloy adjacent to said gate dielectric.

12. The method of claim 10 wherein said silicon or silicon alloy film is deposited above said first surface in such a manner to create a through (311) facet in said deposited silicon or silicon alloy film.

13. The method of claim 4 wherein said deposited silicon or silicon alloy film is doped during said deposition process.

14. The method of claim 13 wherein said deposited silicon or silicon alloy film is doped to a second conductivity type opposite said first conductivity type during said deposition process.

15. The method of claim 4 wherein said silicon or silicon alloy deposition process comprises a first deposition process which forms a silicon or silicon alloy film doped to said first conductivity type and a second silicon or silicon alloy deposition process which dopes said silicon or silicon alloy film to a second conductivity type opposite said first conductivity type.

16. A method of forming a transistor comprising:

forming a gate dielectric layer on a first surface of a first conductivity type region of a substrate;

forming a gate electrode having laterally opposite sidewalls on said gate dielectric layer;

forming a pair of sidewall spacers along laterally opposite sidewalls of said gate electrode;

etching a pair of recesses in said substrate on opposite sides of said gate electrode, wherein said etching exposes said gate dielectric beneath the laterally opposite sidewalls of said gate electrode;

increasing the thickness of said exposed portion of said gate dielectric layer; and depositing a silicon or silicon alloy film in said recesses.

17. The method of claim 16 wherein said pair of recesses are etched with an oxidizing etchant which oxidizes said gate electrode to further increase the thickness of said exposed portion of said gate dielectric layer.

18. The method of claim 16 wherein said etching of said pair of recesses forms inflection points beneath said gate electrode.

19. The method of claim 16 wherein said pair of recesses are etched utilizing an isotropic dry etching process.

20. The method of claim 19 wherein said etching comprises SF6 and He.

21. The method claim 18 further comprising depositing said silicon or silicon alloy above said first surface of said semiconductor substrate such that the top surface of said deposited silicon or silicon alloy is spaced further from said gate electrode than the silicon or silicon alloy adjacent to said gate dielectric.

* * * * *

UNITED STATES PATENT AND TRADEMARK OFFICE
CERTIFICATE OF CORRECTION

PATENT NO. : 6,797,556 B2
DATED : September 28, 2004
INVENTOR(S) : Murthy et al.

It is certified that error appears in the above-identified patent and that said Letters Patent is hereby corrected as shown below:

Column 2,
Line 40, delete "cobaltdigermanosilcide", and insert -- cobaltdigermanosilicide --.

Column 11,
Line 51, delete "$1x10^{17}/cm^3 - 1x10^9/cm^3$" and insert -- $1x10^{17}/cm^3 - 1x10^{19}/cm^3$" --.

Signed and Sealed this

Fourteenth Day of June, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,797,556 B2 | Page 1 of 1 |
| APPLICATION NO. | : 10/338371 | |
| DATED | : September 28, 2004 | |
| INVENTOR(S) | : Anand Murthy et al. | |

It is certified that error appears in the above-identified patent and that said Letters Patent is hereby corrected as shown below:

In the Claims

Col. 12, Line 28, Claim 1, delete "large" and insert --larger-- therein.

Signed and Sealed this
Twenty-sixth Day of August, 2014

Michelle K. Lee
*Deputy Director of the United States Patent and Trademark Office*